(12) United States Patent
Yu et al.

(10) Patent No.: US 9,484,311 B2
(45) Date of Patent: Nov. 1, 2016

(54) CHIP PACKAGE AND PACKAGING METHOD

(71) Applicant: Huawei Technologies Co., Ltd., Shenzhen, Guangdong (CN)

(72) Inventors: Xuequan Yu, Shanghai (CN); Yadong Bai, Shenzhen (CN); Ping Yu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/570,822

(22) Filed: Dec. 15, 2014

(65) Prior Publication Data

US 2015/0102473 A1 Apr. 16, 2015

Related U.S. Application Data

(63) Continuation of application No. PCT/CN2013/070907, filed on Jan. 23, 2013.

(30) Foreign Application Priority Data

Jul. 20, 2012 (CN) .......................... 2012 1 0253444

(51) Int. Cl.
*H01L 23/552* (2006.01)
*H01L 23/055* (2006.01)
*H01L 23/48* (2006.01)
(Continued)

(52) U.S. Cl.
CPC ............ *H01L 23/552* (2013.01); *H01L 23/055* (2013.01); *H01L 23/481* (2013.01); *H01L 24/17* (2013.01); *H01L 24/81* (2013.01); *H01L 23/49805* (2013.01); *H01L 23/66* (2013.01); *H01L 2224/16245* (2013.01); *H01L 2224/1713* (2013.01); *H01L 2224/17179* (2013.01); *H01L 2924/0002* (2013.01);
(Continued)

(58) Field of Classification Search
CPC ... H01L 23/552; H01L 24/81; H01L 23/481; H01L 24/17; H01L 23/055; H01L 23/49805; H01L 23/66
See application file for complete search history.

(56) References Cited

U.S. PATENT DOCUMENTS 5,043,534 A 8/1991 Mahulikar et al.
5,294,826 A 3/1994 Marcantonio et al.
(Continued)

FOREIGN PATENT DOCUMENTS

CN 1442033 A 9/2003
CN 1479477 A 3/2004
(Continued)

*Primary Examiner* — William Coleman

(57) ABSTRACT

A chip package and a packaging method are provided, which relates to the field of communications technologies, and is invented to implement high-frequency electromagnetic interference shielding and effectively improve chip performance. The package includes a package substrate and a metal cap covering the package substrate, where a silicon chip placement area is arranged on an upper surface of the package substrate, multiple first conductive parts are arranged in a peripheral area of the silicon chip placement area, and an edge of the metal cap is in contact with the package substrate and electrically connected to the multiple first conductive parts, where at least a portion of first conductive parts in the multiple first conductive parts are electrically connected to a grounding part by using the metal cap, and the grounding part is arranged on the package substrate, and configured to ground the package substrate.

15 Claims, 2 Drawing Sheets

(51) Int. Cl.
*H01L 23/00* (2006.01)
*H01L 23/498* (2006.01)
*H01L 23/66* (2006.01)

(52) U.S. Cl.
CPC .............. *H01L 2924/01029* (2013.01); *H01L 2924/10253* (2013.01); *H01L 2924/14* (2013.01)

(56) References Cited

U.S. PATENT DOCUMENTS

| | | | |
|---|---|---|---|
| 5,394,011 A * | 2/1995 | Yamamoto et al. | 257/693 |
| 5,763,824 A | 6/1998 | King et al. | |
| 5,796,170 A | 8/1998 | Marcantonio | |
| 5,866,943 A | 2/1999 | Mertol | |
| 5,986,340 A | 11/1999 | Mostafazadeh et al. | |
| 6,051,888 A | 4/2000 | Dahl | |
| 6,075,289 A * | 6/2000 | Distefano | 257/732 |
| 6,333,552 B1 * | 12/2001 | Kakimoto et al. | 257/728 |
| 6,365,960 B1 | 4/2002 | Pollock et al. | |
| 6,512,675 B1 | 1/2003 | Tarter et al. | |
| 6,740,959 B2 | 5/2004 | Alcoe et al. | |
| 6,956,285 B2 | 10/2005 | Radu et al. | |
| 7,582,951 B2 * | 9/2009 | Zhao | H01L 23/3128 257/660 |
| 7,759,168 B2 * | 7/2010 | Behun | H01L 23/04 257/E21.532 |
| 8,043,896 B2 * | 10/2011 | Lee et al. | 438/113 |
| 8,410,584 B2 * | 4/2013 | An | H01L 23/3121 257/659 |
| 8,659,912 B2 * | 2/2014 | Chen | H01F 27/36 361/800 |
| 9,257,394 B2 * | 2/2016 | Chung | H01L 23/552 |
| 2001/0033478 A1 | 10/2001 | Ortiz et al. | |
| 2002/0096767 A1 | 7/2002 | Cote et al. | |
| 2002/0149810 A1 | 10/2002 | Brown et al. | |
| 2003/0025180 A1 | 2/2003 | Alcoe et al. | |
| 2004/0065462 A1 * | 4/2004 | Hayashi | H01L 21/563 174/548 |
| 2005/0151599 A1 | 7/2005 | Ido et al. | |
| 2008/0067656 A1 | 3/2008 | Leung et al. | |
| 2009/0169209 A1 | 7/2009 | Sugawara et al. | |
| 2009/0212401 A1 | 8/2009 | Do et al. | |
| 2012/0074559 A1 | 3/2012 | Budell et al. | |
| 2012/0326293 A1 | 12/2012 | Kobayashi et al. | |

FOREIGN PATENT DOCUMENTS

| | | |
|---|---|---|
| CN | 1539167 A | 10/2004 |
| CN | 1612514 A | 5/2005 |
| CN | 1638117 A | 7/2005 |
| CN | 101083231 A | 12/2007 |
| CN | 101317268 A | 12/2008 |
| CN | 101471731 A | 7/2009 |
| CN | 102185658 A | 9/2011 |
| CN | 102779811 A | 11/2012 |
| WO | WO 2011/111300 A1 | 9/2011 |

* cited by examiner

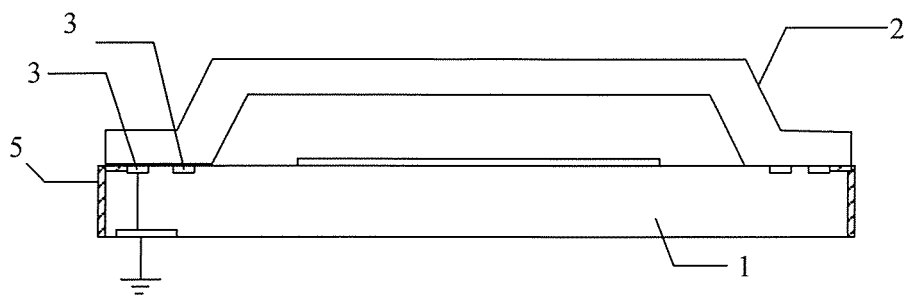

FIG. 3

| Arrange multiple first conductive parts in a peripheral area of a silicon chip placement area on an upper surface of a package substrate | S11 |

| Cover the upper surface of the package substrate by using a metal cap, so that at least a portion of first conductive parts in the multiple first conductive parts are electrically connected to a grounding part by using the metal cap, where the grounding part is arranged on the package substrate, and configured to ground the package substrate | S12 |

FIG. 4

CHIP PACKAGE AND PACKAGING METHOD

CROSS-REFERENCE TO RELATED APPLICATIONS

This application is a continuation of International Application No. PCT/CN2013/070907, filed on Jan. 23, 2013, which claims priority to Chinese Patent Application No. 201210253444.7, filed on Jul. 20, 2012, both of which are hereby incorporated by reference in their entireties.

TECHNICAL FIELD

The present invention relates to the field of communications technologies, and in particular, to a chip package and a packaging method.

BACKGROUND

With rapid development of communications technologies, an operating frequency of a digital Integrated Circuit (IC) chip increases continuously. Because an alternating current electrical signal in the chip can cause electromagnetic radiation to space in a manner of an electromagnetic field, a frequency of a electromagnetic signal radiated outward during chip operating increases therewith and a wavelength of the radiated electromagnetic signal decreases accordingly. Therefore, dimensions of many conductors in the chip may be comparable to the wavelength of the electromagnetic signal. In this case, these conductors present an antenna effect to the electromagnetic signal to radiate the electromagnetic signal with the wavelength comparable to the dimensions of the conductors in a high intensity manner, and when a chip package is provided with a radiator, the antenna effect is more intense due to presence of the radiator, thereby causing electromagnetic interference to other circuits or signals and deteriorating performance of a communications product.

In the prior art, a leading wire or a bolt is generally used at a corner of the radiator of the chip to ground the radiator, so as to implement electromagnetic interference shielding by using a package; however, this method not only occupies too much layout space of a circuit board, but also causes relatively high impedance to a high-frequency signal via an inductive effect generated by the leading wire or the bolt, resulting in poor performance of high-frequency electromagnetic interference shielding.

SUMMARY

Embodiments of the present invention provide a chip package and a packaging method, which can implement high-frequency electromagnetic interference shielding, and improve chip performance.

To achieve the foregoing objectives, embodiments of the present invention adopt the following technical solutions:

According to one aspect, the present invention provides a chip package, which includes a package substrate and a metal cap covering the package substrate, where:

a silicon chip placement area is arranged on an upper surface of the package substrate, multiple first conductive parts are arranged in a peripheral area of the silicon chip placement area, and an edge of the metal cap is in contact with the package substrate and electrically connected to the multiple first conductive parts, where at least a portion of first conductive parts in the multiple first conductive parts are electrically connected to a grounding part by using the metal cap, and the grounding part is arranged on the package substrate, and configured to ground the package substrate.

According to another aspect, the present invention provides a packaging method, which includes:

arranging multiple first conductive parts in a peripheral area of a silicon chip placement area on an upper surface of a package substrate; and covering the upper surface of the package substrate by using a metal cap, so that at least a portion of first conductive parts in the multiple first conductive parts are electrically connected to a grounding part by using the metal cap, where the grounding part is arranged on the package substrate, and configured to ground the package substrate.

According to the foregoing technical solutions, in the chip package and the packaging method provided by the embodiments of the present invention, the multiple first conductive parts are arranged in the peripheral area of the silicon chip placement area of the package substrate, where at least the portion of first conductive parts are electrically connected to the grounding part by using the metal cap. Hence, the multiple first conductive parts and the metal cap form a grounded Faraday cage, to implement favorable high-frequency electromagnetic shielding for a silicon chip arranged therein, so as to effectively improve a shielding effect of the package with respect to high-frequency electromagnetic interference.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

FIG. 3 is another sectional view of a chip package according to an embodiment of the present invention; and FIG. 4 is a flowchart of a packaging method according to an embodiment of the present invention.

DETAILED DESCRIPTION

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
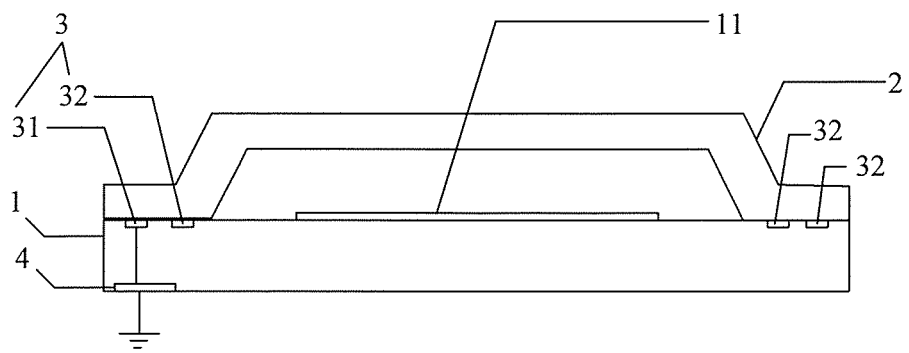
FIG. 1 is a sectional view of a chip package according to an embodiment of the present invention.

FIG. 1 is a sectional view of a chip package according to an embodiment of the present invention. The chip package includes a package substrate 1 and a metal cap 2 covering the package substrate 1, where a silicon chip placement area 11 is arranged on an upper surface of the package substrate 1 and configured to place a silicon chip. Multiple first conductive parts 3 are arranged in a peripheral area of the silicon chip placement area 11, and an edge of the metal cap 2 is in contact with the package substrate 1, and electrically connected to the multiple first conductive parts 3, where at least a portion of first conductive parts 32 in the multiple first conductive parts 3 are electrically connected to a grounding part 4 by using the metal cap 2, and the grounding part 4 is arranged on the package substrate 1, and configured to ground the package substrate 1.

According to the foregoing technical solution, in the chip package provided by the embodiment of the present invention, the multiple first conductive parts 3 are arranged in the peripheral area of the silicon chip placement area 11 of the package substrate 1, where at least the portion of first conductive parts 32 are electrically connected to the grounding part 4 by using the metal cap 2. Hence, the multiple first conductive parts 3 and the metal cap 2 form a grounded Faraday cage, to implement favorable high-frequency electromagnetic shielding for the silicon chip arranged therein, so as to effectively improve a shielding effect of the package with respect to high-frequency electromagnetic interference.

It should be noted that the grounding part 4 may be arranged in any position on the package substrate 1. For example, the grounding part 4 may be arranged on the upper surface of the package substrate 1, and may also be arranged at other layers of the package substrate 1, such as a bottom surface of the package substrate 1 opposite to the upper surface thereof or a middle layer between the upper surface and the bottom surface. As shown in FIG. 1, when the grounding part 4 is arranged at other layers of the package substrate 1, a through hole (not shown) may be formed in the package substrate 1, so that a portion of first conductive parts 31 in the multiple first conductive parts 3 are directly and electrically connected to the grounding part 4 by using the through hole.

Specifically, in this embodiment, the portion of first conductive parts 31 in the multiple first conductive parts 3 may be directly and electrically connected to the grounding part 4, and another portion of first conductive parts 32 in the multiple first conductive parts 3 may be electrically connected, by using the metal cap 2, to the first conductive parts 31 that are directly and electrically connected to grounding part, so that the first conductive parts 32 are also electrically connected to the grounding part 4.

It should be noted that the upper surface of the package substrate 1 is generally coated with a solder mask material, so the package substrate 1 does not easily bond with a conductor such as metal. In order to arrange the first conductive parts 3 on the package substrate 1, in this embodiment, multiple windows are formed on the upper surface of the peripheral area of the silicon chip placement area 11, where the windows may be openings of a round, a square, or other arbitrary shapes and are arranged on the solder mask material of the upper surface of the package substrate 1, and the first conductive parts 3 are arranged inside the windows.

Specifically, the metal cap 2 may be electrically connected to the first conductive parts 3 in multiple manners. For example, in this embodiment, the first conductive parts 3 are coated with a conductive adhesive, and the edge of the metal cap 2 in contact with the package substrate 1 is electrically connected to the first conductive parts 3 by using the conductive adhesive. In another embodiment of the present invention, the edge of the metal cap 2 may be electrically connected to the first conductive parts 3 by using solder balls. Certainly, in other embodiments of the present invention, the metal cap 2 may be electrically connected to the first conductive parts 3 in other manners, which is not limited by the present invention.

Optionally, the first conductive parts 3 may be organic conductive films, and may also be semiconductor films, metal films, and so on, which is not limited by the present invention. Because copper has excellent conductivity and lower cost, the first conductive parts 3 are preferably copper-plated.

It should be noted that in some embodiments of the present invention, the first conductive parts 31 are directly connected to the grounding part 4, and the first conductive parts 32 are electrically connected to the first conductive parts 31 by using the metal cap 2, and hence are electrically connected to the grounding part 4. However, in the present invention, a grounding manner of the first conductive parts 3 is not limited to this. In other embodiments of the present invention, all the first conductive parts 3 may be electrically connected to the metal cap 2, and the metal cap 2 is electrically connected to the grounding part 4 by welding or conductive adhesive adhering or in other manners, provided that the first conductive parts 3 and the metal cap 2 form a Faraday cage.

Figure 2:
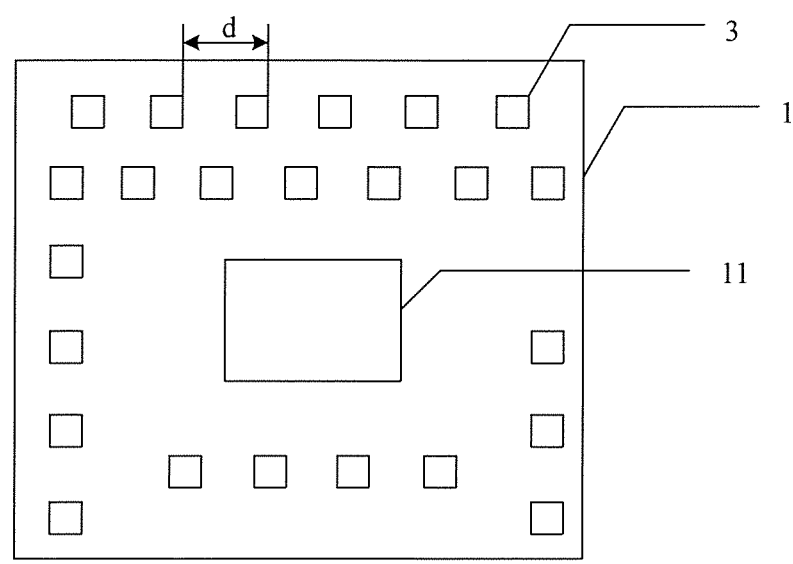
FIG. 2 is a top view of a package substrate of a chip package according to an embodiment of the present invention.

FIG. 2 is a top view of a package substrate 1 of a chip package according to an embodiment of the present invention. As shown in FIG. 2, one row or multiple rows of first conductive parts 3 are arranged in a peripheral area of a silicon chip placement area 11, and distances d between the first conductive parts 3 may be equal or unequal, and the number of the rows of the first conductive parts 3 and the distances d may be set according to a frequency of an electromagnetic signal to be shielded.

Specifically, because signal frequencies on different pins of a same silicon chip are different, frequencies of electromagnetic interference in different positions of a same silicon chip may also be different. Considering that, only when dimensions of conductors or distances between conductors are comparable to a wavelength of the electromagnetic signal, a strong antenna effect is presented to an electromagnetic signal to control the distances d between the first conductive parts 3, values of distances between the conductors may therefore be controlled, so that the values of the distances d are far away from the wavelength of the electromagnetic signal near the conductors. Hence, the conductors are prevented from generating an antenna effect to the electromagnetic signal, and a shielding effect of the package with respect to electromagnetic interference is effectively improved.

For example, in an embodiment of the present invention, a signal frequency on a pin A1 of a silicon chip is 500 MHz, and a signal frequency on a pin A22 is 10 GHz, that is, a wavelength of the signal in the pin A1 is much longer than that in the pin A22, so that the distances between the first conductive parts 3 near the pin A1 may be longer than the distances between the first conductive parts 3 near the pin A22. This means that length of the conductors near the pin A1 is longer than length of the conductors near the pin A22. In this way, electromagnetic signals near the pin A1 and the pin A22 can both be well shielded.

Further, as shown in FIG. 3, in order to inhibit an edge radiation effect on side walls of a package substrate 1 with respect to an electromagnetic signal, and further improve an electromagnetic shielding effect of a chip package, preferably, in an embodiment of the present invention, the package substrate 1 may be further provided with second conductive parts 5. The second conductive parts 5 are arranged on the side walls of the package substrate 1, extended to an upper surface of the package substrate 1, and electrically connected to first conductive parts 3, so that the first conductive parts 3, the second conductive parts 5, and the metal cap 2 form a Faraday cage with a wider range, so as to more effectively improve the shielding effect of the chip package with respect to high-frequency electromagnetic interference.

Optionally, the second conductive parts 5 may be organic conductive films, and may also be semiconductor films, metal films, and so on, which is not limited by the present invention.

Correspondingly, as shown in FIG. 4, an embodiment of the present invention further provides a packaging method, which includes:

S11. Arrange multiple first conductive parts in a peripheral area of a silicon chip placement area on an upper surface of a package substrate.

S12. Cover the upper surface of the package substrate by using a metal cap, so that at least a portion of first conductive parts in the multiple first conductive parts are electrically connected to a grounding part by using the metal cap, where the grounding part is arranged on the package substrate, and configured to ground the package substrate.

In the packaging method provided by the embodiment of the present invention, the multiple first conductive parts are arranged in the peripheral area of the silicon chip placement area of the package substrate, and at least the portion of first conductive parts are electrically connected to the grounding part by using the metal cap that covers the package substrate. Hence, the multiple first conductive parts and the metal cap form a grounded Faraday cage, thereby implementing favorable high-frequency electromagnetic shielding for a silicon chip arranged inside the Faraday cage, and effectively improving a shielding effect of the package with respect to high-frequency electromagnetic interference.

Specifically, in an embodiment of the present invention, step S11 may specifically include: arranging the multiple first conductive parts in the peripheral area of the silicon chip placement area on the upper surface of the package substrate, where a portion of first conductive parts in the multiple first conductive parts are directly and electrically connected to the grounding part.

Then step S12 may specifically include: covering the upper surface of the package substrate by using the metal cap, so that another portion of first conductive parts in the multiple first conductive parts are electrically connected, by using the metal cap, to the first conductive parts that are directly and electrically connected to the grounding part.

Optionally, before step S11, the method further includes: forming a through hole in the package substrate. Then step S11 may specifically include: arranging the multiple first conductive parts in the peripheral area of the silicon chip placement area on the upper surface of the package substrate, where the portion of first conductive parts in the multiple first conductive parts are directly and electrically connected to the grounding part by using the through hole.

It should be noted that the upper surface of the package substrate is generally a solder mask material, so the package substrate does not easily bond with a conductor such as metal. In order to arrange the first conductive parts on the package substrate, optionally, in an embodiment of the present invention, step S11 may specifically include:

forming multiple windows in the peripheral area of the silicon chip placement area on the upper surface of the package substrate; and arranging the first conductive parts inside the windows.

Further, after step S11 and before step S12, the method further includes:

arranging second conductive parts on the package substrate, where the second conductive parts are arranged on side walls of the package substrate, extended to the upper surface of the package substrate, and electrically connected to the first conductive parts. Therefore, the first conductive parts, the second conductive parts, and the metal cap form a Faraday cage with a wider range to inhibit an edge radiation effect on the side walls of the package substrate with respect to an electromagnetic signal, so as to more effectively improve a shielding effect of the chip package with respect to high-frequency electromagnetic interference.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A chip package, comprising:
   a package substrate and a metal cap covering the package substrate;
   a silicon chip placement area arranged on an upper surface of the package substrate;
   a plurality of first conductive parts arranged on the upper surface of the package substrate in a peripheral area of the silicon chip placement area; and
   a plurality of second conductive parts, the second conductive parts being arranged on side walls of the package substrate, extended to the upper surface of the package substrate, and electrically connected to the first conductive parts,
   wherein an edge of the metal cap contacting the package substrate is electrically connected to the first conductive parts,
   wherein at least one first conductive part of the first conductive parts is electrically connected to a grounding part by using the metal cap, and the grounding part is arranged on the package substrate, and configured to ground the package substrate, the first conductive parts, the second conductive parts, and the metal cap forming a Faraday cage, the Faraday cage providing high-frequency electromagnetic shielding for the silicon chip placement area and inhibiting an edge radiation effect on the side walls of the package substrate with respect to an electromagnetic signal, and
   wherein a distance between at least two first conductive parts is selected according to a frequency of an electromagnetic signal to be shielded.

2. The package according to claim 1, wherein a first conductive part in the first conductive parts except the at least one first conductive part is directly and electrically connected to the grounding part, and the at least one first conductive part of the first conductive parts is electrically connected, by using the metal cap, to the first conductive part that is directly and electrically connected to the grounding part.

3. The package according to claim 1, wherein the distance between the at least two first conductive parts is selected according to a frequency of an electromagnetic signal on a pin near the at least two first conductive parts.

4. The package according to claim 1, wherein the first conductive parts comprise at least one of an organic conductive film, a semiconductor film, and a metal film.

5. The package according to claim 1, wherein the second conductive parts comprise at least one of an organic conductive film, a semiconductor film, and a metal film.

6. The package according to claim 2, wherein:
a through hole is formed in the package substrate; and
the first conductive part in the first conductive parts except the at least one first conductive part is directly and electrically connected to the grounding part by using the through hole.

7. The package according to claim 6, wherein:
windows are formed on an upper surface of the peripheral area of the silicon chip placement area of the package substrate, and the first conductive parts are arranged inside the windows.

8. The package according to claim 7, wherein:
the first conductive parts are coated with a conductive adhesive; and
the edge of the metal cap is electrically connected to the first conductive parts by using the conductive adhesive.

9. The package according to claim 7, wherein the edge of the metal cap is electrically connected to the first conductive parts by using solder balls.

10. The package according to claim 8, wherein the first conductive parts are arranged in the peripheral area of the silicon chip placement area in one row or multiple rows.

11. The package according to claim 4, wherein the first conductive parts are copper-plated.

12. A packaging method, comprising:
arranging a plurality of first conductive parts in a peripheral area of a silicon chip placement area on an upper surface of a package substrate;
arranging a plurality of second conductive parts on the package substrate, the second conductive parts being arranged on side walls of the package substrate, extended to the upper surface of the package substrate, and electrically connected to the first conductive parts; and
covering the upper surface of the package substrate by using a metal cap, so that at least one first conductive part of the first conductive parts is electrically connected to a grounding part by using the metal cap, wherein the grounding part is arranged on the package substrate, and configured to ground the package substrate, the first conductive parts, the second conductive parts, and the metal cap forming a Faraday cage, the Faraday cage providing high-frequency electromagnetic shielding for the silicon chip placement area and inhibiting an edge radiation effect on the side walls of the package substrate with respect to an electromagnetic signal,
wherein a distance between at least two first conductive parts is selected according to a frequency of an electromagnetic signal to be shielded.

13. The method according to claim 12, wherein:
arranging first conductive parts in a peripheral area of a silicon chip placement area on an upper surface of a package substrate comprises:
arranging the first conductive parts in the peripheral area of the silicon chip placement area on the upper surface of the package substrate, wherein a first conductive part in the first conductive parts except the at least one first conductive part is directly and electrically connected to the grounding part; and
covering the upper surface of the package substrate by using a metal cap, so that at least one first conductive part of the first conductive parts is electrically connected to a grounding part by using the metal cap comprises:
covering the upper surface of the package substrate by using the metal cap, so that the at least one first conductive part of the first conductive parts is electrically connected, by using the metal cap, to the first conductive part that is directly and electrically connected to the grounding part.

14. The method according to claim 13, wherein:
before arranging the first conductive parts in the peripheral area of the silicon chip placement area on the upper surface of the package substrate, the method further comprises forming a through hole in the package substrate; and
arranging the first conductive parts in the peripheral area of the silicon chip placement area on the upper surface of the package substrate, wherein the first conductive part in the first conductive parts except the at least one first conductive part is directly and electrically connected to the grounding part comprises:
arranging the first conductive parts in the peripheral area of the silicon chip placement area on the upper surface of the package substrate, wherein the first conductive part in the first conductive parts except the at least one first conductive part is directly and electrically connected to the grounding part by using the through hole.

15. The method according to claim 12, wherein arranging first conductive parts in a peripheral area of a silicon chip placement area on an upper surface of a package substrate comprises:
forming windows in the peripheral area of the silicon chip placement area on the upper surface of the package substrate; and
arranging the first conductive parts inside the windows.

* * * * *